United States Patent
Sheng et al.

(10) Patent No.: US 6,587,017 B1
(45) Date of Patent: Jul. 1, 2003

(54) METHOD AND APPARATUS FOR CALIBRATED PHASE-SHIFT NETWORKS

(75) Inventors: Samuel W. Sheng, San Jose, CA (US); Lapoe E. Lynn, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/957,232

(22) Filed: Sep. 20, 2001

(51) Int. Cl.[7] ................................................ H03H 7/32
(52) U.S. Cl. ..................... 333/139; 333/32; 333/138; 333/164; 327/252; 327/237
(58) Field of Search ................... 333/139, 32, 28, 333/138, 140, 117, 119, 164; 327/252, 237

(56) References Cited

U.S. PATENT DOCUMENTS

| | | | | |
|---|---|---|---|---|
| 4,532,518 A | * | 7/1985 | Gaglione et al. | 333/17.1 |
| 4,599,585 A | * | 7/1986 | Vorhaus et al. | 333/139 |
| 4,682,128 A | * | 7/1987 | Sproul et al. | 333/139 |
| 4,733,203 A | * | 3/1988 | Ayasli | 333/139 |
| 4,961,062 A | * | 10/1990 | Wendler | 333/164 |
| 4,978,931 A | * | 12/1990 | Carp et al. | 333/139 |
| 5,136,265 A | * | 8/1992 | Pritchett | 333/139 |
| 5,237,629 A | * | 8/1993 | Hietala et al. | 333/139 |
| 6,137,377 A | * | 10/2000 | Wallace et al. | 333/139 |

OTHER PUBLICATIONS

"Integrated Continuous–Time Balanced Filters for 16–b DSP Interfaces", By Anna M. Durham and William Redman–White, IEEE Journal of Solid–State Circuits, vol. 28, No. 7, Jul. 1993, pp. 835–839.

* cited by examiner

Primary Examiner—Michael Tokar
Assistant Examiner—Lam T. Mai
(74) Attorney, Agent, or Firm—Christopher P. Maiorana, P.C.

(57) ABSTRACT

An apparatus comprising a first calibration circuit and a phase shift network stage. The first calibration circuit may be configured to generate a control signal. The phase shift network stage may comprise one or more tunable phase shift elements and be configured to provide a tunable impedance. The phase shift network stage may be tuned in response to the control signal and a conductance of the tunable phase shift elements.

16 Claims, 5 Drawing Sheets

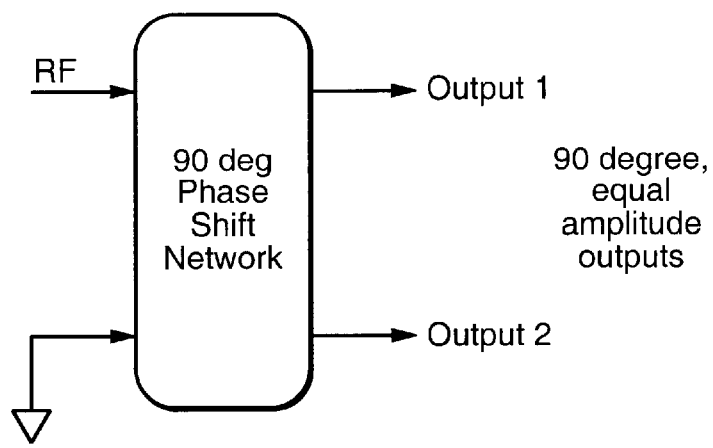
FIG._1a
*(CONVENTIONAL)*
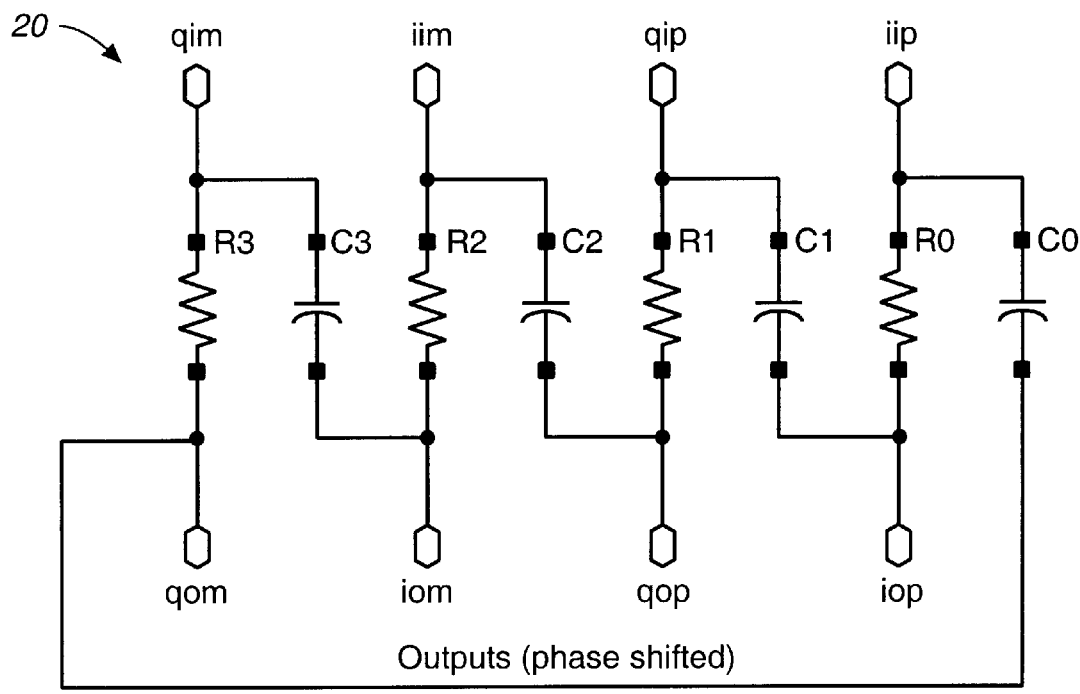
FIG._2a
*(CONVENTIONAL)*

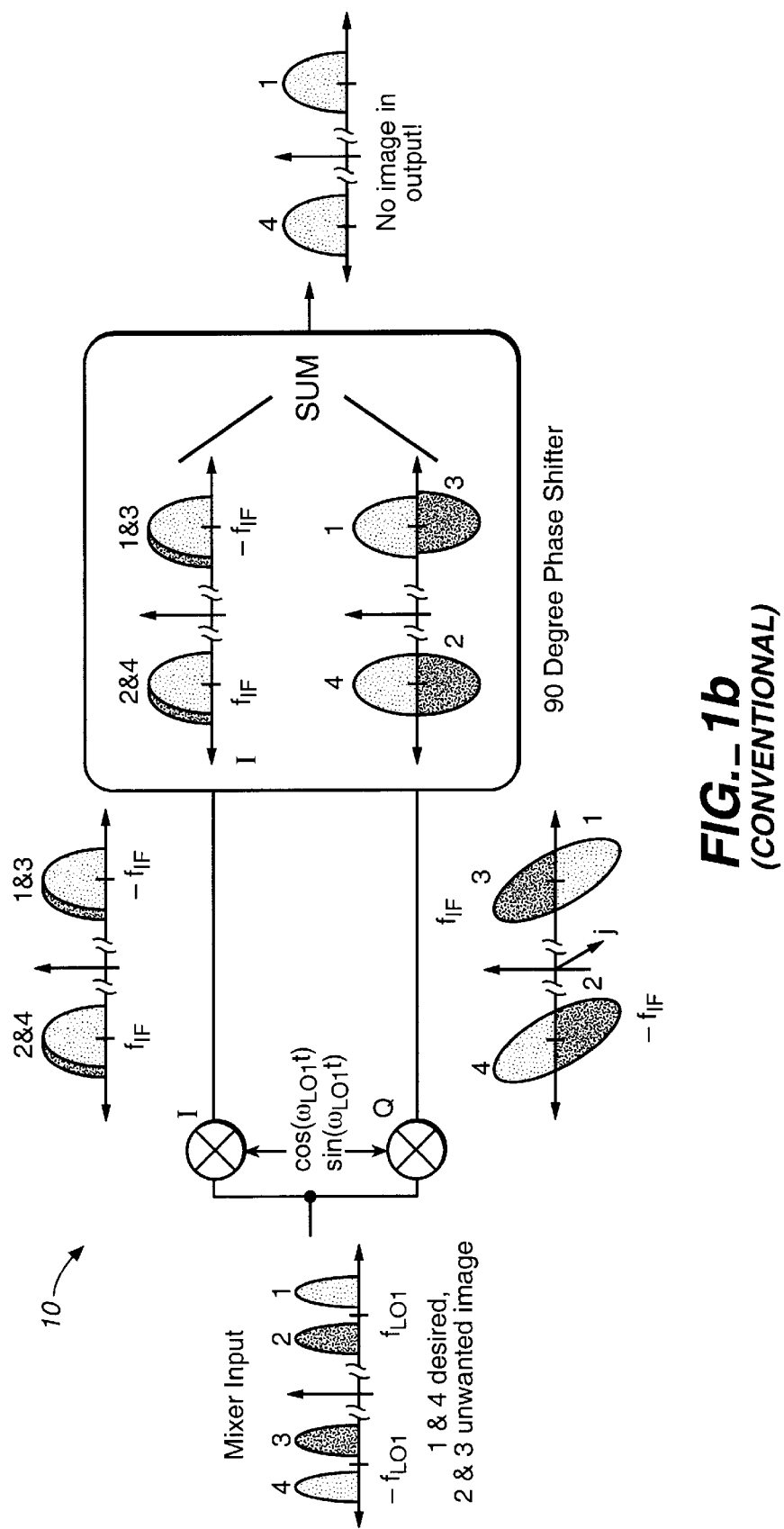
FIG._1b *(CONVENTIONAL)*

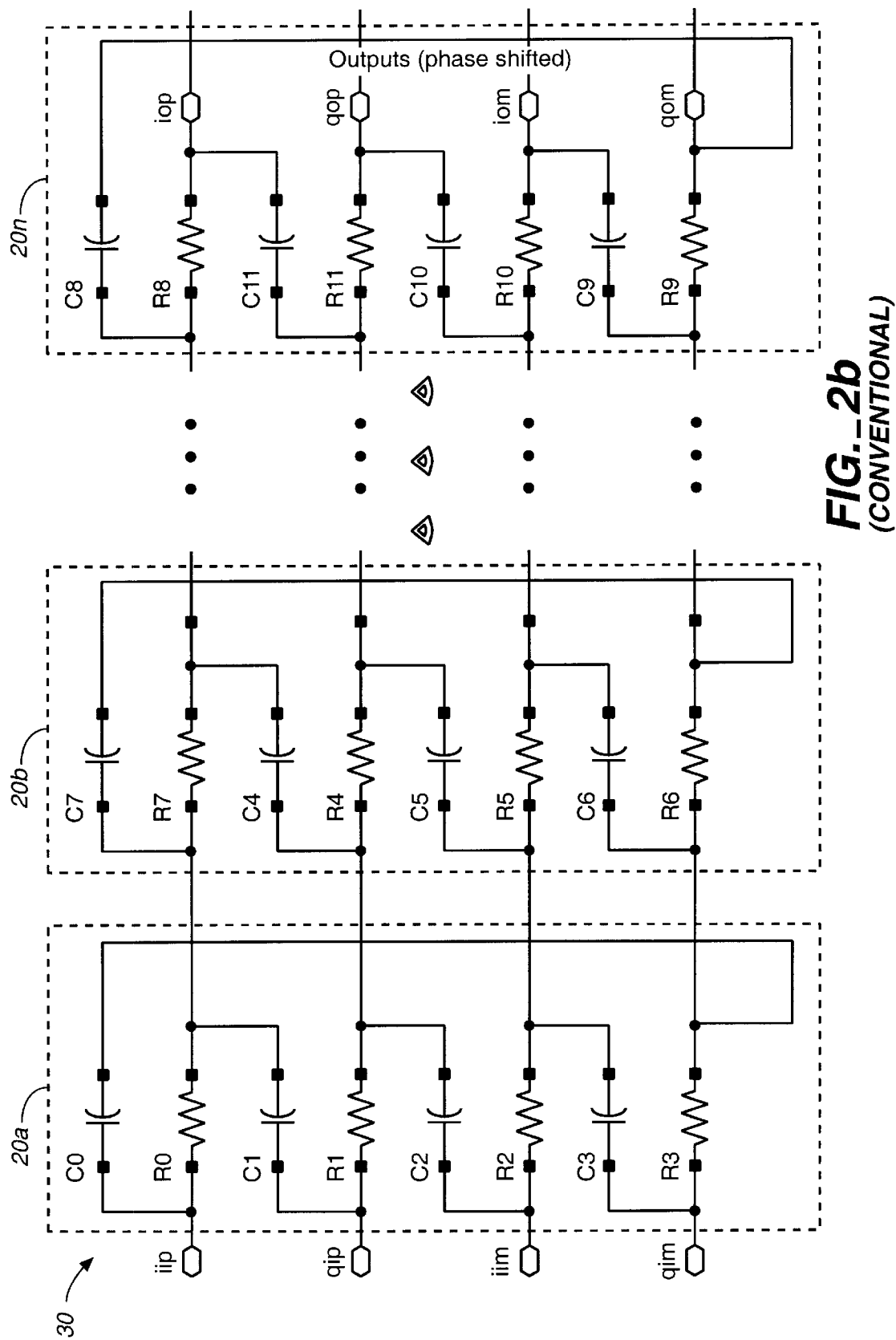
FIG._2b *(CONVENTIONAL)*

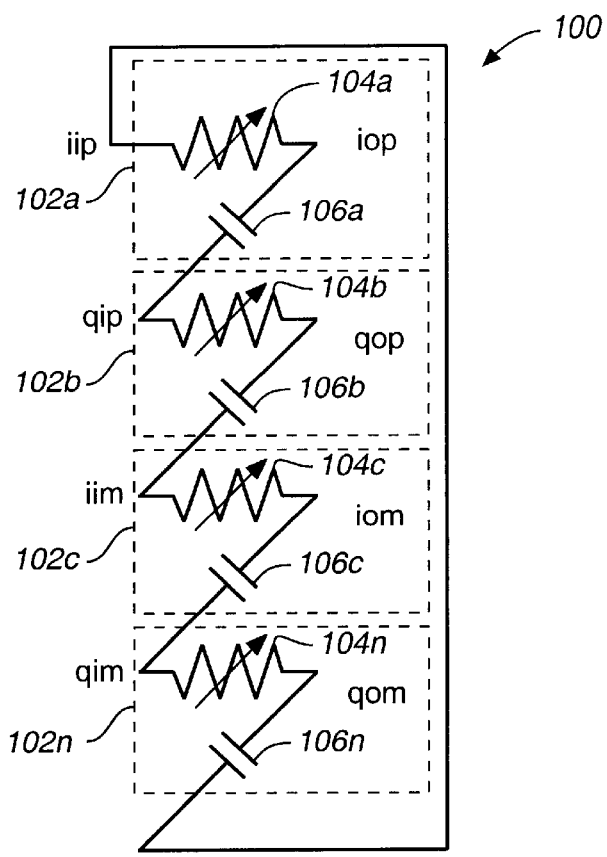
FIG._3
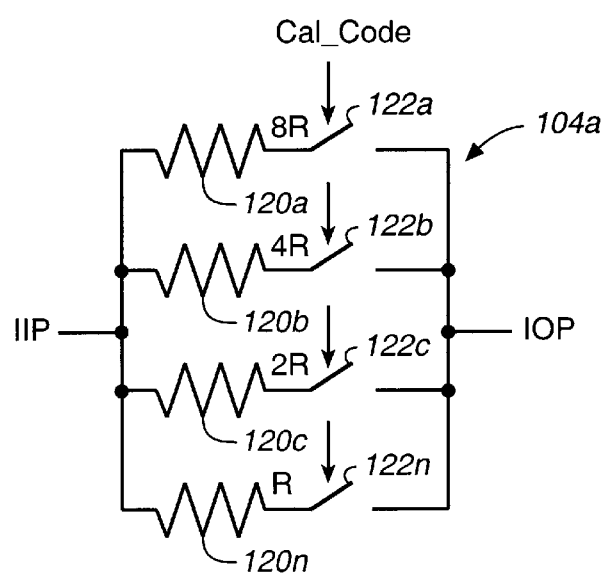
FIG._4

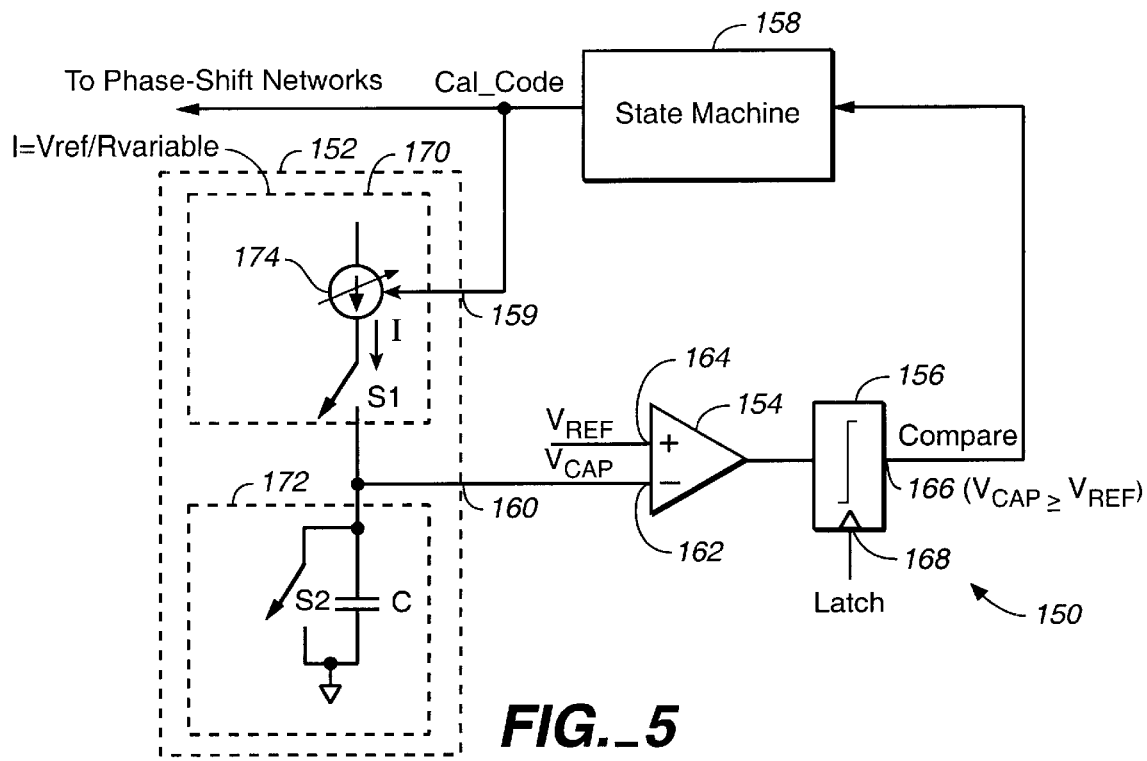
FIG._5
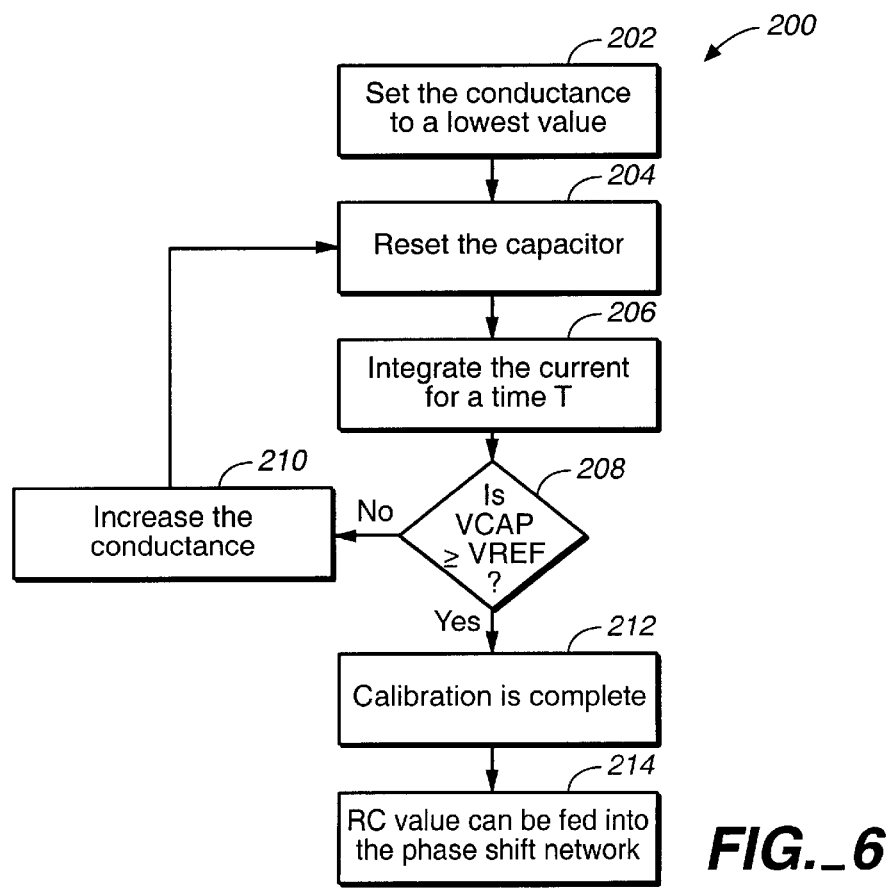
FIG._6

METHOD AND APPARATUS FOR CALIBRATED PHASE-SHIFT NETWORKS

FIELD OF THE INVENTION

The present invention relates to a method and/or architecture for calibrating phase-shift networks generally and, more particularly, to high frequency or narrowband signal processing.

BACKGROUND OF THE INVENTION

Referring to FIGS. 1a and 1b, a pair of high-frequency (or narrowband) signal processing applications 10 utilizing phase-shift networks are shown. The signal processing application 10 of FIG. 1a synthesizes (or generates) two signals with a specific, 90 degree (i.e., quadrature) phase relationship to each other. A narrowband input RF (i.e., a single sinusoid) is fed into the phase shift network 10 of FIG. 1a, which then outputs two desired quadrature signals of equal amplitude and 90 degree phase relationship. A second input to the phase-shift network 10 of FIG. 1a is coupled to ground.

The signal processing application 10 of FIG. 1b is an image-rejection mixer (found in cellular phones, wireless local-area networks, television tuners, etc.). An incoming radio-frequency (RF) signal is fed into two separate mixers, one driven by a sine wave, and the other driven by a cosine wave. The filter is typically implemented as a low pass filter (or as no filter at all). The output of each mixer has the classic problem of undesired image-band conversion, where not only the desired signal (i.e., 1 and 4) is converted into the mixer output, but also any signal at the associated image frequency (i.e., 2 and 3). The phase-shift network 10 of FIG. 1b combines the outputs of both mixers, due to the 90 degree phase relationship of the undesired image and the desired signal, the phase-shift network 10 of FIG. 1b can then separate the two signals, leaving only the desired signal.

In the phase-shift networks 10, the critical performance metric of the phase-shift network is in gain/phase matching. How well balanced the outputs of FIG. 1a, or how well separated the undesired image of FIG. 1b, is determined by how accurately the phase-shift network 10 can achieve the desired 90 degree phase relationship.

Referring to FIG. 2a, a conventional resistor-capacitor (RC) ladder network method for implementing a phase-shift network 20 is shown. Since the PSN 20 is implemented using only resistors and capacitors, integration in standard silicon is amenable. However, such PSN architectures have the drawback of only achieving precision 90 degree phase shifts at one specific frequency (i.e., $\omega=1/(R*C)$). Furthermore, typical applications only allow for a phase shift error of approximately 1 degree (i.e., the PSN must shift somewhere between 89 and 91 degrees). Thus, any on-chip variability will substantially limit the effectiveness of such a PSN. For example, a 500 MHz PSN meeting a 1 degree phase error specification would require on-chip resistors and capacitors accurate to better than 0.5%. Laser trimming can achieve the exceptionally high level of accuracy. However, laser trimming is expensive and difficult to implement (i.e.; inappropriate for high-volume consumer applications such as cellular phones).

Referring to FIG. 2b, a conventional cascaded multiple phase-shift network circuit 30 is shown. The cascaded PSN circuit 30 provides a range of frequencies over which accurate phase shift occurs. The circuit 30 allows for on-chip resistor and capacitor tolerances. Therefore, the circuit 30 is insensitive to on-chip variability. However, every additional stage of phase shift results in signal attenuation (since the circuit 30 is passive), as well as additional noise from the resistors. Thus, a designer is strongly motivated to utilize as few stages of phase-shift as possible, while meeting the performance requirements.

SUMMARY OF THE INVENTION

The present invention concerns an apparatus comprising a first calibration circuit and a phase shift network stage. The first calibration circuit may be configured to generate a control signal. The phase shift network stage may comprise one or more tunable phase shift elements and be configured to provide a tunable impedance. The phase shift network stage may be tuned in response to the control signal and a conductance of the tunable phase shift elements.

The objects, features and advantages of the present invention include providing a method and/or architecture for calibrating phase-shift networks that may (i) be automatically calibrated, (ii) be implemented without requiring laser trim, (iii) implement fewer stages and/or (iv) be implemented without other costly per-part manufacturing adjustments.

BRIEF DESCRIPTION OF THE DRAWINGS

These and other objects, features and advantages of the present invention will be apparent from the following detailed description and the appended claims and drawings in which:

FIGS. 1(a–b) are block diagrams of typical phase-shift networks;

FIGS. 2(a–b) are schematics of conventional resistor capacitor (RC) ladder circuits;

FIG. 3 is a block diagram of a preferred embodiment of the present invention;

FIG. 4 is a block diagram of a phase-shift network of FIG. 3;

FIG. 5 is a detailed block diagram of a tuned conductance array of FIG. 4; and

FIG. 6 is a flowchart illustrating an operation of the present invention.

DETAILED DESCRIPTION OF THE PREFERRED EMBODIMENTS

The present invention may be implemented as a method and apparatus for implementing a calibrated phase-shift network. The present invention may allow the manufacturing tolerance and on-chip variability of resistors and capacitors to be automatically calibrated without requiring laser trim or other costly per-part manufacturing adjustments. The invention generally comprises two parts (i) a separate (low-frequency) RC calibration block (to be discussed in connection with FIG. 5) and (ii) a modified phase-shift network (to be discussed in connection with FIGS. 3 and 4). Additionally, the phase-shift network may be tunable without impairing any desired phase-shift characteristics.

Referring to FIG. 3, a block diagram of a circuit 100 is shown in accordance with a preferred embodiment of the present invention. The circuit 100 is shown implemented as a phase-shift network (PSN). The PSN 100 generally comprises a number of blocks 102a–102n. In one example, the blocks 102a–102n may be implemented as calibrated stages. The calibrated configuration of the PSN 100 may allow for a reduced number of stages when compared to conventional uncalibrated PSN stages due to the reduced number of stages. Additionally, the calibrated stages 102a–102n may decrease noise. Each of the blocks 102a–102n generally comprises a variable resistance device (or circuit) 104 and a capacitor 106. The variable resistance circuit 104 and the capacitor 106 may be coupled in series. In one example, the variable resistance circuit 104 may be implemented as a tuned conductance array.

The variable resistance 104a may have a first side coupled to a node (e.g., IIP) and a second side coupled to a node (e.g., IOP). The capacitor 106a may have a first side coupled to the node IOP and a second side coupled to a node (e.g., QIP). The variable resistance 104b may have a first side coupled to the node QIP and a second side coupled to a node (e.g., QOP). The capacitor 106b may have a first side coupled to the node QOP and a second side coupled to a node (e.g., IIM). The variable resistor 104c may have a first side coupled to the node IIM and a second side coupled to a node (e.g., IOM). The capacitor 106c may have a first side coupled to the node IOM and a second side coupled to a node (e.g., QIM). The variable resistor 104n may have a first side coupled to the node QIM and a second side coupled to a node (e.g., QOM). The capacitor 106n may have a first side coupled to the node QOM and a second side coupled to the node IIP. The nodes IIP, QIP, IIM, and QIM may be implemented as input nodes. The nodes IOP, QOP, IOM and QOM may be implemented as output nodes.

Referring to FIG. 4, a detailed block diagram of the tuned conductance array 104a is shown. The arrays 104b–104n may be similar to the array 104a. The array 104a generally comprises a number of resistors 120a–120n and a number of switches 122a–122n. The resistors 120a–120n and the switches 122a–122n may be coupled in series, respectively. The switches 122a–122n may be digitally controlled via a signal (e.g., CAL_CODE). The signal CAL_CODE may be implemented as a multi-bit control signal. The control signal CAL_CODE may depend on a process corner. The signal CAL_CODE may control a conductance of the PSN 100.

The resistor 120a may have a resistance (e.g., R). The resistor 120b may have a resistance (e.g., 2R). The resistor 120c may have a resistance (e.g., 4R). The resistor 120n may have a resistance (e.g., 8R). The resistors 120a–120n may be configured to provide a tuned conductance via the switches 122a–122n and the signal OUT.

A first side of the resistors 120a–120n may each be coupled to the node IIP. A second side of the resistors 120a–120n may be coupled to a first side of the switches 122a–122b, respectively. A second side of the switches 122a–122n may be coupled to the node IOP. The switches 122a–122n may be controlled by the signal CAL_CODE.

The phase-shift network 100 generally comprises an untuned capacitance (e.g., the capacitors 106a–106n) coupled with a tunable resistance (e.g., the variable resistors 104a–104n) with respect to a particular conductance. The circuit 100 may be configured to tune the variable resistors 104a–104n and not the capacitors 106a–106n.

The phase-shift network 100 may achieve functionality by tuning the variable resistance circuits 104a–104n. The current in the capacitive branches 106a–106n of the phase-shift network 160 may be precisely 90 degrees out of phase with the current in the resistive branches 104a–104n. In a calibrated phase-shift network, a 90 degree phase-shift relationship may be used to allow the PSN 100 function properly. Additionally, tuning devices (such as the switches 122a–122n) may introduce parasitics into the network 100 that may be accounted for.

If the capacitors 106a–106n are tuned, instead of the resistors 104a–104n, the parasitic resistance intrinsic to the tuning switches 122a–122n may cause the phasing of the current in the capacitive branch 106a–106n to be incorrect. For example, with a typical operating frequency (e.g., hundreds of MHz), and large capacitive values (e.g., the order of ten pF), a typical parasitic switch resistance may be large (e.g., on the order of one ohm) in order to achieve a 1 degree phase shift. Such typical switch implementations may be prohibitively large, consuming silicon area and introducing additional (e.g., capacitive) parasitics. Therefore, it is generally desirable to tune the variable resistance circuits 104a–104n. Additionally, any parasitic resistance in the resistive branches 104a–104n of the phase shift network 100 may not change the phase relationship, and hence do not affect the functionality of the network 100.

The circuit 100 may allow the resistance branches 104a–104n and the capacitors 106a–106n to be tuned to provide tunable impedance. Providing a tunable resistance (e.g., the resistance circuit 104a–104n) may be superior to a tunable capacitance (e.g., the capacitors 106a–106n). The circuit 100 may be configured to provide a PSN with a tunable impedance, resistive or capacitive. Preferably, the PSN 100 may be resistively tunable via the resistive circuits 104a–104n.

To achieve better than 1% resolution in the phase-shift network 100 may require extremely fine granularity. By tuning the conductance, the least-significant bit of the tuned conductance array 104a may be the largest resistor 120a (e.g., the smallest conductance), and thus the least sensitive to tuning switch parasitics. Therefore, smaller tuning switches (e.g., the switches 122a–122n) with higher parasitic resistances and smaller parasitic capacitance may be implemented. The switches 122a–122n may be ideal for high-frequency operation.

Referring to FIG. 5, a low-frequency calibration device (or circuit) 150 is shown. The circuit 150 generally comprises a device (or circuit) 152, a voltage comparator 154, a latch 156 and a state machine 158. The circuit 152 may be implemented as a low-frequency RC calibration circuit. The circuit 152 may have an input 159 that may receive the signal CAL_CODE and an output 160 that may present a signal (e.g., VCAP). The voltage comparator 154 may have an input 162 that may receive the signal VCAP. The voltage comparator 154 may also have an input 164 that may receive a signal (e.g., VREF). The signal VREF may be input to a positive "+" input of the voltage comparator 154 and the signal VCAP may be input to a negative "−" input of the voltage comparator 154. The voltage comparator 154 may be configured to present a signal to the latch 156.

The latch may have an output 166 that may present a signal (e.g., COMPARE) and an input 168 that may receive a signal (e.g., LATCH). The signal COMPARE may indicate if the voltage VCAP is greater or equal to the voltage VREF. The latch 156 may be configured to latch the output from the voltage comparator 154 and present the signal COMPARE on a transition of the signal LATCH). In one example, the latch 156 may latch an output data on a positive transistor of the signal LATCH. A particular configuration of the voltage comparator 154 and/or the latch 156 may be varied in order to meet the criteria of a particular implementation.

The state machine 158 may have an input 167 that may receive the signal COMPARE. The state machine 158 may also have an output 169 that may present the signal CAL_CODE. The signal CAL_CODE may set the variable conductance resistance of the circuit 152. In one example, the state machine 158 may be implemented as a controller, a processor, or a DSP. However, a particular implementation of the state machine 158 may be varied in order to meet the design criteria of a particular implementation.

The circuit 152 generally comprises a device (or circuit) 170 and a device (or circuit) 172. The circuits 170 and 172 may each be coupled to the node VCAP. The circuit 170 may comprise a current source 174 that may present a current (e.g., I) and a switch (e.g., S1). The current I may be programmable. The current I may be set during calibration via the signal CAL_CODE. The circuit 172 may be implemented as a switchable capacitance circuit. The circuit 172 generally comprises a capacitance (e.g., C) and a reset switch (e.g., S2).

The calibration circuit 150 may be configured to perform against a resistor conductance. The circuit 150 may feed the programmable current I referenced to an on-chip resistor (not shown), into the on-chip capacitor C. As the current I integrates onto the capacitor C, the voltage VCAP may be generated and compared against the known fixed (e.g., process-invariant) reference voltage VREF. The integration time may be accurately controlled by an external crystal clock source (not shown).

Referring to FIG. 6, a process (or method) 200 of the present invention is shown. The state machine 158 may be configured to implement the process 200. The process 200 may illustrate an operation of the RC calibration circuit 150 and a calibration of the PSN 100. The process 200 generally comprises a state 202, a state 204, a state 206, a decision state 208, a state 210, a state 212 and a state 214. The process 200 may be configured to calibrate and control the phase-shift network 100.

While in the state 202, the process 200 may set a conductance of the variable resistor circuits 104a–104n to a lowest value. Since the programmable current 174 is set by a replica of the resistor circuits 104a–104n, the current I may be set to a lowest current state. While in the state 204, the capacitor 172 may be reset. While in the state 206, the process 200 may then integrate the current I for time (e.g., T). While in the decision state 208, the process 200 may determine if the voltage VCAP is equal to or greater than the voltage VREF (e.g., in response to the signal COMPARE). If the voltage VCAP is less than the voltage VREF, the process 200 may continue to the state 210. While in the state 210, the process 200 may increase the conductance slightly and return to the state 204. The voltage VCAP may then become equal to or greater than the voltage VREF. Since the integrating current is proportional to the conductance, the point at which VCAP equals VREF (VCAP=T*VREF*G/C=VREF) implies that G/C=T. Since the time T is set by a crystal, it is well-known and accurate (e.g., substantially better than 1%). Referring back to the state 208, if the voltage VCAP is greater than the voltage VREF, the process 200 may continue to the state 212. While in the state 212, the on-chip RC (e.g., G-C) product may be sufficiently calibrated. While in the state 214 the RC value (e.g., the signal CAL_CODE) may be fed into the phase-shift network 100.

The function performed by the flow diagram of FIG. 6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a first calibration circuit configured to generate a control signal; and a plurality of phase shift network stages each (a) configured to provide a tunable impedance, and (b) comprising one or more tunable phase shift elements, wherein (i) each phase shift network stage is tuned in response to said control signal and a conductance of said tunable phase shift elements and (ii) each phase shift network is programmable.

2. The apparatus according to claim 1, wherein each of said tunable phase shift elements comprises:

a resistor circuit having a tunable resistance.

3. The apparatus according to claim 2, wherein said resistor circuit comprises a tuned conductance array.

4. The apparatus according to claim 1, wherein each of said tunable phase shift elements comprise:

a capacitor having a tunable capacitance.

5. The apparatus according to claim 2, wherein said resistor circuit is configured in response to said control signal.

6. The apparatus according to claim 5, wherein said control signal comprises a multibit control signal.

7. The apparatus according to claim 2, wherein said resistor circuit is digitally controlled.

8. The apparatus according to claim 2, wherein said resistor circuit comprises:

a plurality of resistors; and a plurality of switches coupled to said resistors and configured to provide tunable conductance.

9. The apparatus according to claim 8, wherein each of said resistors have a different resistance.

10. The apparatus according to claim 8, wherein each of said switches is digitally controlled.

11. A method for calibrating a phase shift network, comprising the steps of:

(A) generating a control signal; and (B) tuning an impedance to phase shift an input signal in response to said control signal and a conductance, wherein step (B) is digitally controlled and further comprises (i) tuning a tunable capacitance and (ii) tunable resistance.

12. The method according to claim 11, wherein step (B) is responsive to a conductance of one or more tunable phase shifting elements.

13. The method according to claim 11, wherein said control signal comprises a multibit control signal.

14. An apparatus comprising:

a first calibration circuit configured to generate a multi-bit control signal; and a phase shift network stage configured to provide a tunable impedance, comprising one or more tunable phase shift elements, wherein (i) each of said phase shift elements comprises a resistor circuit having a tunable resistance, (ii) said phase shift network stage is tuned in response to (a) said multi-bit control signal and (b) a conductance of said tunable phase shift elements and (iii) said resistor circuit is configured in response to said multi-bit control signal, wherein said phase shift network stage is programmable.

15. An apparatus comprising:

a first calibration circuit configured to generate a control signal; and a phase shift network stage configured to provide a tunable impedance, comprising one or more tunable phase shift elements, wherein (i) each of said phase shift elements comprises a resistor circuit (a) having a tunable resistance and (b) comprising a plurality of resistors and a plurality of switches coupled to said resistors and configured to provide tunable conductance, (ii) said phase shift network stage is tuned in response to said control signal and a conductance of said tunable phase shift elements and (iii) said phase shift network is programmable.

16. The apparatus according to claim 15, wherein said phase shift network stage is programmable.

* * * * *